(12) United States Patent
Farquhar et al.

(10) Patent No.: US 8,344,389 B2
(45) Date of Patent: Jan. 1, 2013

(54) OPTOELECTRONIC DEVICE ARRAY

(75) Inventors: Donald Seton Farquhar, Niskayuna, NY (US); Michael Scott Herzog, Voorheesville, NY (US)

(73) Assignee: General Electric Company, Niskayuna, NY (US)

( * ) Notice: Subject to any disclaimer, the term of this patent is extended or adjusted under 35 U.S.C. 154(b) by 191 days.

(21) Appl. No.: 12/696,510

(22) Filed: Jan. 29, 2010

(65) Prior Publication Data

US 2011/0186866 A1 Aug. 4, 2011

(51) Int. Cl.
*H01L 27/32* (2006.01)

(52) U.S. Cl. ............ 257/72; 257/40; 257/E27.131; 257/E27.135; 257/E27.152; 349/144; 345/1.1; 345/698; 345/3.3

(58) Field of Classification Search ............... None
See application file for complete search history.

(56) References Cited

U.S. PATENT DOCUMENTS

| | | | |
|---|---|---|---|
| 2004/0021425 A1 | 2/2004 | Foust et al. | |
| 2004/0081751 A1* | 4/2004 | Nakanishi et al. | 427/108 |
| 2004/0141130 A1* | 7/2004 | Kawata et al. | 349/139 |
| 2005/0093001 A1 | 5/2005 | Liu et al. | |
| 2005/0258436 A1 | 11/2005 | Arai | |
| 2006/0066223 A1 | 3/2006 | Pschenitzka | |
| 2006/0226522 A1 | 10/2006 | Liu et al. | |
| 2007/0001583 A1 | 1/2007 | Nabeta et al. | |
| 2009/0023232 A1 | 1/2009 | Taniguchi et al. | |

FOREIGN PATENT DOCUMENTS

| | | |
|---|---|---|
| EP | 1612658 A2 | 1/2006 |
| JP | 61138286 A | 6/1986 |
| JP | 2004251981 A | 9/2004 |
| JP | 2005017738 A | 1/2005 |

OTHER PUBLICATIONS

PCT International Search Report and Written Opinion, mailing date Nov. 25, 2010.
Search Report and Written Opinion from corresponding PCT Application No. PCT/US2011/021125 mailed on Jun. 8, 2011.

* cited by examiner

*Primary Examiner* — Fei Fei Yeung Lopez
(74) *Attorney, Agent, or Firm* — Mary Louise Stanford (57) ABSTRACT

An optoelectonice device array includes a plurality of packages, each enclosing an optoelectronic device, and positioned in at least one row. Each package overlaps at least one adjacent package, and may be hermetically sealed.

22 Claims, 10 Drawing Sheets

OPTOELECTRONIC DEVICE ARRAY

BACKGROUND

Optoelectronic devices generally include light-emitting devices and photovoltaic devices. These devices generally include an active layer sandwiched between two electrodes, sometimes referred to as the front and back electrodes, at least one of which is typically transparent. The active layer typically includes one or more semiconductor materials. In a light-emitting device, e.g., an organic light-emitting diode (OLED) device, a voltage applied between the two electrodes causes a current to flow through the active layer. The current causes the active layer to emit light. In a photovoltaic device, e.g., a solar cell, the active layer absorbs energy from light and converts it to electrical energy which generates a flow of current at some characteristic voltage between the two electrodes.

The light is transmitted through at least one of the electrodes of an OLED device. The design of a suitable transparent electrode requires that it provide in-plane electrical conductivity (favoring a thicker layer of material) and that it provide optical transmission through its thickness (favoring a thinner layer of material). To resolve these opposing constraints on the electrode design, it is preferred to limit the size of individual light emitting regions (pixels), and thus limit the amount of current that is flowing laterally in the plane of the electrode. If the current is low, the resistive losses in the electrode are low and the resulting device is efficient. In the one case, a pixel is defined by unlit lines that define its perimeter, and the current is bused to these regions. In another case, the pixel may be defined by points that define its perimeter, and current is bused to the electrode(s) at these points. In either case, the unlit regions interrupt the otherwise uniform appearance of an OLED. The typical maximum dimension for a pixel in the direction of current flow is on the order of 1 cm before excessive loss and non-uniform appearance results. Approaches to solving this problem include making the unlit regions very small (increasing the complexity of the manufacturing process) or to obscure them with a diffusing film (reducing efficiency and adding cost). Thus it is desirable to decrease the appearance of unlit regions so that large uninterrupted areas light can be created. More generally, it is desirable to configure large arrays of lighted areas from individual pixels while providing design flexibility. Accordingly, it is desirable to configure pixels in an arbitrary ordered on disordered array patterns, to introduce pixels of different size, shape, color and brightness, and spacing, and also to be able to replace individual pixels in the array.

BRIEF DESCRIPTION

Briefly, in one aspect, the present invention relates to an array including a plurality of packages positioned in at least one row, each package enclosing an optoelectronic device; each package overlaps at least one adjacent package. Each package may include an edge seal zone defining an electroactive area; at least a portion of the edge seal zone is transparent; the electroactive area of a first package in each row is overlapped by the transparent portion of the edge seal zone of an adjacent package; the transparent portion of the edge seal zone of each package other than the first package in each row overlaps the electroactive area of an adjacent package; and optionally, wherein the plurality of packaged optoelectronic devices is configured to form a continuous light emitting area. In some embodiments, a portion of the edge seal zone of each package is non-transparent, and the electroactive area of each package in the row overlaps the non-transparent portion of the edge seal zone of an adjacent package. The packages may be hermetically sealed.

In another aspect, the present invention relates to a package enclosing an optoelectronic device that includes an edge seal zone defining an electroactive area. At least a portion of the edge seal zone is transparent and a portion of the edge seal zone being non-transparent, and the non-transparent portion of the edge seal zone includes a conductive layer configured to connect an anode and a cathode of the optoelectronic device to an external power source via a plurality of terminals. Optionally, an electrically insulating layer is disposed between the anode and the conductive layer in the non-transparent portion of the edge seal zone, and configured to electrically isolate the anode from the cathode. In some embodiments, the cathode and the anode extend through a non-transparent portion of the edge seal zone. The packages may be hermetically sealed.

In yet another aspect, the present invention relates to an optoelectronic device having an unpatterned electrode comprising a transparent conductive oxide, particularly indium tin oxide. The device may additionally include a metallization layer directly disposed on the unpatterned electrode and configured to be in electrical communication with the unpatterned electrode and a power source.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
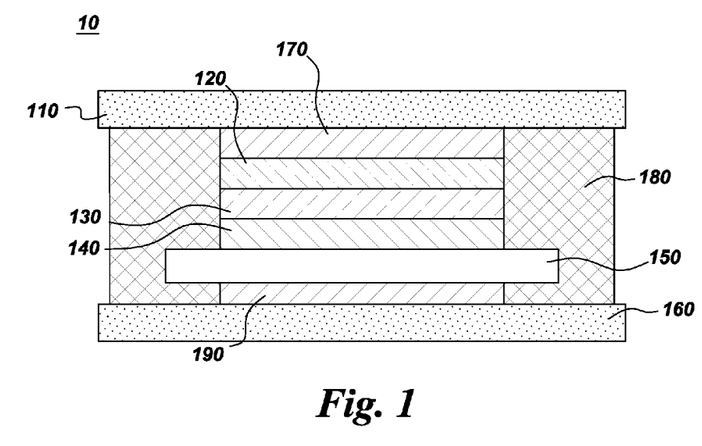
FIG. 1 is a cross sectional view of a package for use in the arrays of the present invention.

FIG. 1 is a cross sectional view of optoelectronic device package 10 that is suitable for use in the lighting arrays of the present invention, showing first barrier layer 110, first electrode 120, electroactive layer(s) 130, second electrode 140, optional substrate 150, and second barrier layer 160. In embodiments where substrate 150 is not present, second electrode 140 may be disposed directly on second barrier layer 160. Adhesive layer 170 is disposed between first barrier layer 110 and first electrode 120, and between first barrier layer 110 and second barrier layer 160, forming edge seal zone 180. In some embodiments, second electrode 140 may be coextensive with substrate 150, and adhesive layer 170 may be partially disposed on second electrode 140, forming edge seal zone 180. In other embodiments, substrate 150 may be coextensive with layers 160 and 180. The edge seal zone The geometry of the edge seal zone is designed to minimize ingress of water and oxygen; adhesive layer 170 forming the bond between first and second barrier layers 110 and 160 is thin and broad and thus provide the preferred geometry. The adhesive material of adhesive layer 170 is selected to provide a strong bond between the substrate and the backsheet, and to be relatively impermeable to moisture and oxygen ingress. The adhesive is free from moisture and chemically inert so that it does not degrade the materials that make up the device, particularly the electrode and the materials of the electroactive layers. To the extent that adhesive 170 extends to the edge seal zone 180 beyond the light emitting region, it should be transparent. A wide range of adhesives including transparent thermoplastics, pressure sensitive adhesives, acrylics, and thermosetting epoxies and urethanes are potentially suitable. Low cost materials and processing are, for example, enabled by selecting a heat seal material such as Rohm & Haas Adcote 37T77 which is provided as a dispersion that can be pre-applied to the barrier layers and then dried. Lamination of the barrier layers to the OLED device then can be completed with brief exposure to moderate heat and pressure, for example in a continuous roll lamination process. Optional adhesive layer 190 is disposed between second electrode 140 and second barrier layer 160 when substrate 150 is present.

Substrate 150 and first and second barrier layers 110 and 160 may be opaque or transparent, although at least one surface of the device, that is, first barrier layer 110 or substrate 150 and/or second barrier layer 160 is transparent in order that light emitted or absorbed by device 10 may pass through from or to electroactive layer(s) 130. In one example, substrate 150 is transparent and composed of glass or a plastic such as polyesters (PET, PEN). The barrier layers are each relatively impermeable to moisture and oxygen; transparent materials suitable for use as a barrier layer include glass and ultra high barrier (UHB) films, for example, as described in U.S. Pat. No. 7,015,640, U.S. Pat. No. 7,154,220, and U.S. Pat. No. 7,397,183 assigned to the General Electric Company. Metal foils are suitable for opaque barrier layers. Second electrode 140 may be either a cathode or an anode; in some embodiments, second electrode 140 is the anode. In particular, second electrode 140 may be an anode composed of indium tin oxide (ITO). Electroactive layer(s) 130 is (are) one or more layers that collectively act to emit (for an OLED device) or absorb (for a PV device) light, and may include hole and electron injecting layers, hole and electron transporting layers and emissive layers. Various means of depositing the layers are known in the art, including vacuum and non-vacuum processes. Materials suitable for use in OLED devices and PV devices, and methods for manufacturing such devices are well known and will not be described here in detail.

Figure 2A:
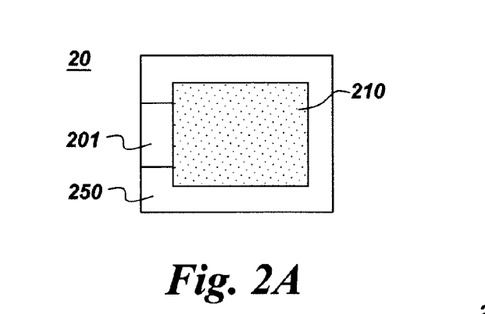
FIGS. 2A-2D are sectional views through layers of a package used in the lighting arrays of the present invention.

FIG. 2A is a transverse sectional view through an electroactive layer of package 20 that is suitable for use in the lighting arrays of the present invention, showing insulating layer 201, electroactive area 210, and exposed layers 250 that underlie area 210, and include an electrode, a substrate, adhesive layer(s), and/or barrier layer(s). In a particular embodiment, the electrode is the anode; more particularly, the anode is composed of ITO. Electroactive area 210 includes a second electrode and electroactive layers sandwiched between the electrodes in addition to the underlying layers. Device 20 is depicted as a single pixel, that is, a single light emitting expanse, but may include multiple smaller pixels. Insulating layer 201 is typically thin, and has about the same thickness as electroactive area 210, and has a smooth boundary with electroactive area 210. The insulating layer is confined to edge seal zone 226, and does not extend into electroactive area 210. Insulating layer 201 may be composed of various organic or inorganic insulators. In one example, a low viscosity cyanoacrylate adhesive with a viscosity of about 1-10 cPs may be applied to form a thin insulating coating prior to depositing electrode 220. In another example, a thin layer (less than 1 micron) of inorganic silicon dioxide may be deposited through a mask to form insulating layer 201. Organic materials may be applied by any of various printing or coating techniques; inorganic materials may be deposited by vapor deposition methods, for example, vacuum evaporation, sputtering, and chemical vapor deposition.

Figure 2B:
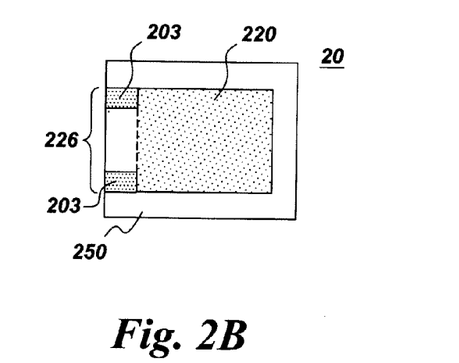

In one embodiment, device 20 is manufactured without patterning the anode. Such a process may be more economical because fewer steps are required, and may also yield a device with improved properties. In a non-limiting example, an ITO layer is provided on a plastic substrate; a transparent UHB layer may be provided between the ITO layer and the substrate or on the other surface of the substrate. The substrate region defines the approximate final shape of the device. The substrate may be in a continuous roll format or a large panel, so that portions of multiple regions may be coated. An insulating layer composed of an organic material may be applied to the unpatterned anode from a low viscosity coating composition by any of various printing or coating techniques, or an inorganic insulating layer may be deposited on the unpatterned anode by vacuum evaporation or other vapor deposition methods. The step height difference at the edge of the coating is typically minimized. Electroactive layers are deposited directly on the unpatterned anode, leaving a gap between the electroactive area and the perimeter of the substrate on some or all edges. A metal cathode layer is deposited directly on the insulating layer and electroactive layers, and optionally on selected portions of the anode, through a mask. The metal layer may be formed, for example, via a vapor deposition process or a printing-type process using conductive ink. In an alternate embodiment, the ITO anode is selectively removed by an etching process from the region otherwise defined by insulating layer 201, thus exposing the bare substrate 150 and obviating the need for insulating layer 201. The subsequent steps of depositing electroactive layers and a cathode layer are unaltered. FIG. 2B is a transverse sectional view through an electrode layer of one embodiment of package 20. The electrode layer 220 shown is the one that is not disposed on the substrate, analogous to first electrode 120 of FIG. 1. In this embodiment, the first electrode 220 is the cathode and may be opaque; an OLED device having this configuration is described as bottom emitting. In other embodiments, the layer is the transparent electrode, and is described as top-emitting. FIG. 2B shows cathode area 220, underlying layers 250 that are the base for forming the transparent portions of the edge seal zone, and optional areas 203. Cathode area 220 and conductive areas 203 include a transparent or opaque conductive layer. Suitable materials for the conductive layer of areas 220 and 203 are known in the art and include metals in elemental form, such as aluminum and silver, and transparent conductive oxides such as ITO and zinc tin oxide. In particular, a thin layer of aluminum may be used. In cathode area 220, the layer is disposed over and is coextensive with insulating layer 201 and electroactive area 210 (not shown). Optional conductive areas 203 are disposed directly on the anode. Use of an additional conductive layer in electrical contact with the anode is particularly desirable to improve conductivity of an anode composed of a material with limited intrinsic conductivity such as ITO. Moreover, by adding a conductive layer, for example a metal, a low resistance electrical contact to the anode in area 203 may be more readily formed.

Figures 2C, 2D:
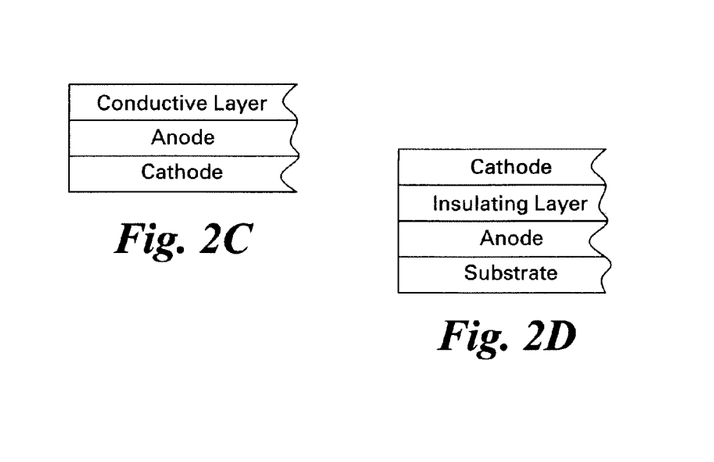

Non-transparent edge seal zone 226 includes conductive areas 203 that are in electrical communication with the anode, that are composed of two conductive layers without an insulating layer between, shown in FIG. 2C, and an extension of cathode area 220 and the underlying anode and the insulating layer separating them, shown in FIG. 2D, that is composed of two layers of conductive material and the insulating layer that prevents shorting between the conductive layers. In the embodiment where the ITO is etched away in the region otherwise defined by insulating layer 201, the cathode area 220 is similarly in electrical communication with the region that extends to non-transparent edge seal zone 226, and is composed of only one conducting layer.

Hermetic packaging of the device is completed using suitable structures and methods. Various types of hermetic packages and methods for manufacturing them have been described in U.S. patent application Ser. No. 12/336,683, filed on 17 Dec. 2008, Ser. No. 12/510,463, filed on 28 Jul. 2009, and Ser. No. 12/470,033, filed on 21 May 2009, and Ser. No. 12/570,024, filed on 30 Sep. 2009, the entire contents of which are incorporated within by reference. For example, a transparent protective backsheet may be bonded to the back of the device. The protective backsheet may be positioned and aligned with the substrate so that part of edge seal zone 226 in electrical communication with the anode and the cathode is exposed. Suitable materials for the transparent backsheet include glass or plastic with a barrier film. It may be bonded to the underlying layers with an optically transparent adhesive that is typically selected to provide a strong bond, and is free from moisture and chemically inert so that it does not degrade the OLED, and relatively impermeable to moisture and oxygen edge ingress. The seal geometry is designed to be sufficiently thin and wide to minimize ingress.

Figure 3:
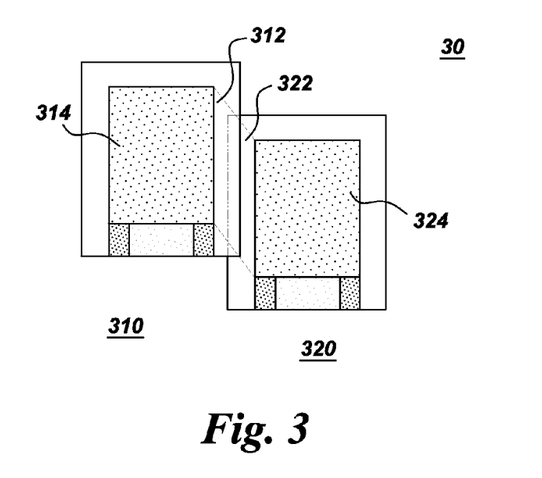
FIG. 3 is a schematic view of an array according to the present invention showing overlapping packaged optoelectronic devices.

FIG. 3 is a schematic view of array 30 showing overlapping optoelectronic device packages 310 and 320. The transparent portion of edge seal zone 312 of device 310 overlaps electroactive area 324 of device 320 and transparent portion 322 of device 320 overlaps electroactive area 314 on the reverse surface of device 310. Light emitted by an OLED or to be absorbed by a PV device is able to pass through the overlapped transparent portions. For an OLED, electroactive areas 314 and 324 may be positioned without an intervening non-light emitting area, forming a continuous light emitting area. It should be noted that the present invention is not limited to packages having a transparent edge seal zone; in such embodiments, light emitting or light absorbing areas may be separated by non- emitting/absorbing areas.

Figure 4:
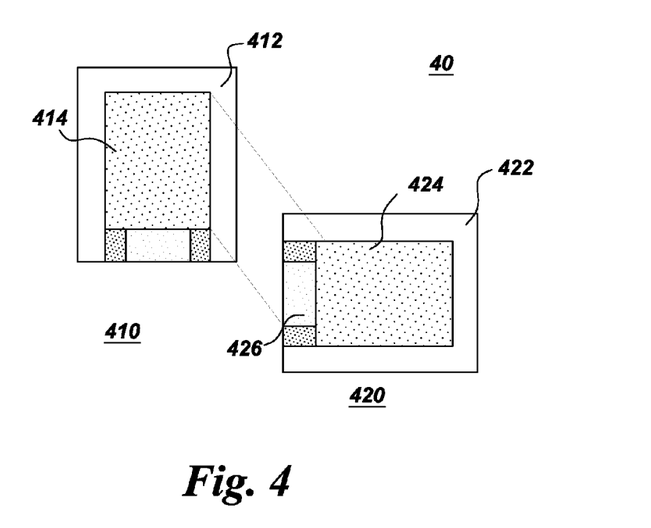
FIG. 4 is a schematic diagram of an array according to the present invention having packaged optoelectronic devices oriented orthogonally to each other.

FIG. 4 a schematic view of array 40 showing overlapping packages 410 and 420 oriented orthogonally to each other. The transparent portion 422 of edge seal zone 412 of device 410 overlaps electroactive area 424 of device 420, and electroactive area 414 of device 410 overlaps non-transparent portion of edge seal zone 426 of device 420, forming a continuous light emitting or absorbing area on one surface of the array.

Figure 5:
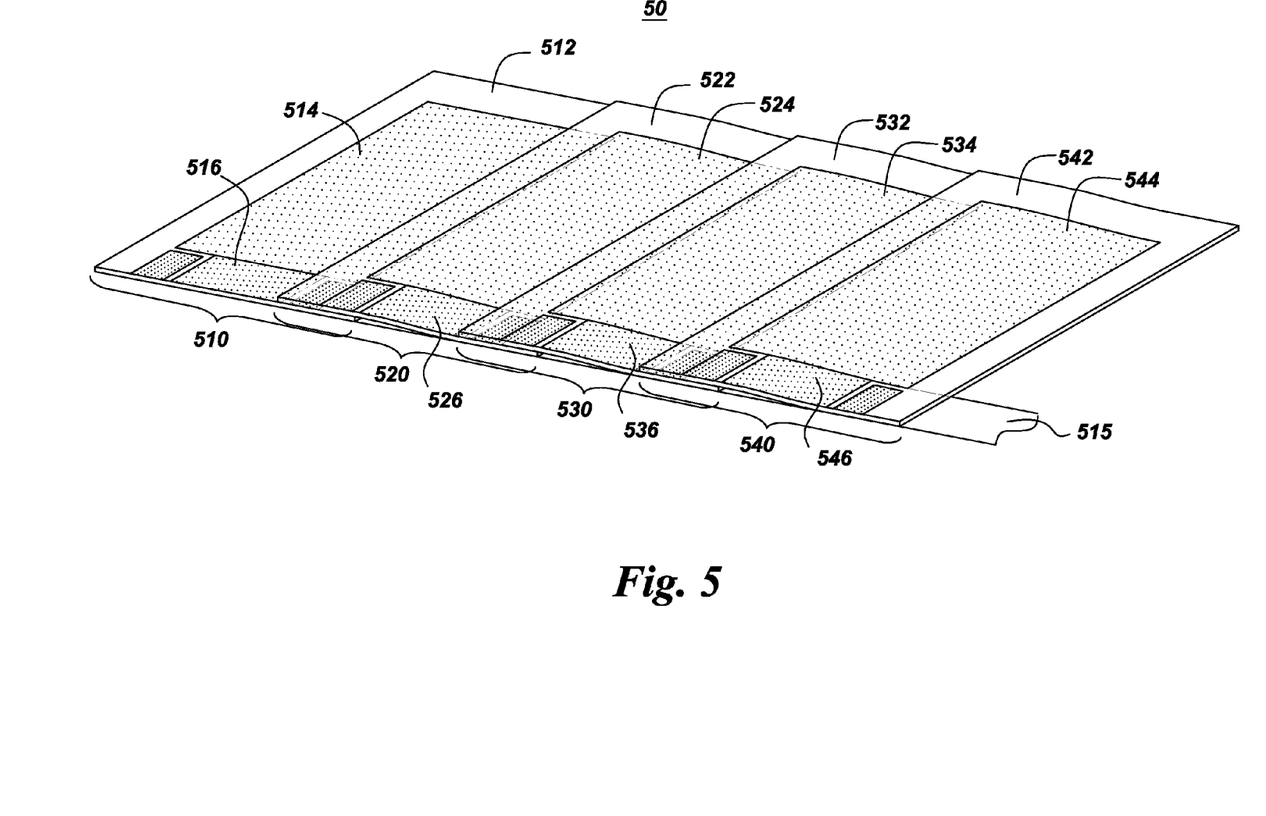
FIG. 5 is a schematic diagram of an array according to the present invention having a single row of packaged optoelectronic devices oriented with non-transparent portions of the edge seal zone linearly aligned.

FIG. 5 is a schematic view of array 50 showing overlapping packages 510, 520, 530, and 540 arranged in one row and oriented with non-transparent portions 516, 526, 536, 546 of the edge seal zone of each device linearly aligned. Electroactive area 514 of the first device in the row, device 510, is overlapped by transparent portion 522 of the edge seal zone of adjacent device 520. Transparent portions 532 and 542 of the edge seal zones of devices 530 and 540 in the row overlap electroactive areas 524 and 534 of adjacent devices 520 and 530. Non-transparent portions 516, 526, 536, 546 are disposed along linear bus bar 515 and may connected thereto for powering the array.

Figure 6:
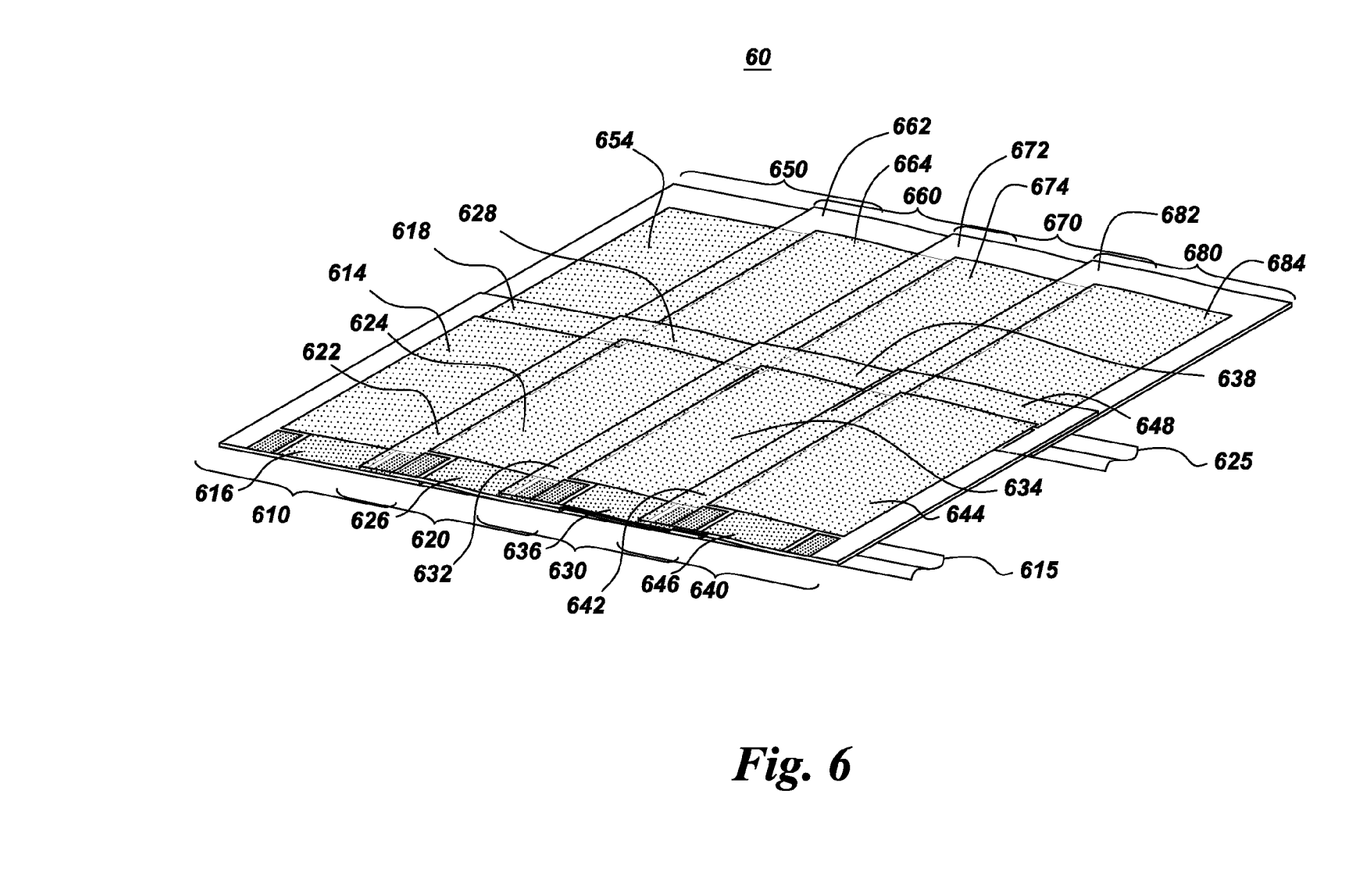
FIG. 6 is a schematic view of an array according to the present invention having two rows of packaged optoelectronic devices oriented with non-transparent portions of the edge seal zone linearly aligned.

FIG. 6 is a schematic view of array 60 showing two rows of overlapping packages 610, 620, 630, 640, 650, 660, 670, and 680 oriented with non-transparent portions 616, 626, 636, 646 of the edge seal zone of each device in the first row linearly aligned, and non-transparent portions of the edge seal zone of each device in the second row (not shown) linearly aligned with each other. Electroactive area 614 of the first device in the first row, device 610, is overlapped by transparent portion 622 of the edge seal zone of adjacent device 620. Transparent portions 632 and 642 of the edge seal zones of devices 630 and 640 in the row overlap electroactive areas 624 and 634 of adjacent devices 620 and 630. Electroactive area 654 of the first device in the second row, device 650, is overlapped by transparent portion 662 of the edge seal zone of adjacent device 660. Transparent portions 672 and 682 of the edge seal zones of devices 670 and 680 in the row overlap electroactive areas 664 and 674 of adjacent devices 660 and 680. Electroactive areas 614, 624, 634 and 644 of devices 610, 620, 630 and 640 in the first row overlap non-transparent portions (not shown) of the edge seal zone of each device in the second row, and transparent portions 618, 628, 638, and 648 of the edge seal zones of devices 610, 620, 630, and 640 overlap non-transparent areas (not shown) of adjacent devices 650, 660, 670, and 680. Non-transparent portions 616, 626, 636, 646 of devices 610, 620, 630, and 640 in the first row are disposed along linear bus bar 615 and may be connected thereto in order to power the row, and non-transparent portions of the edge seal zone of each device in the second row are disposed along linear bus bar 625 and may be connected thereto in order to power the row.

Figure 7:
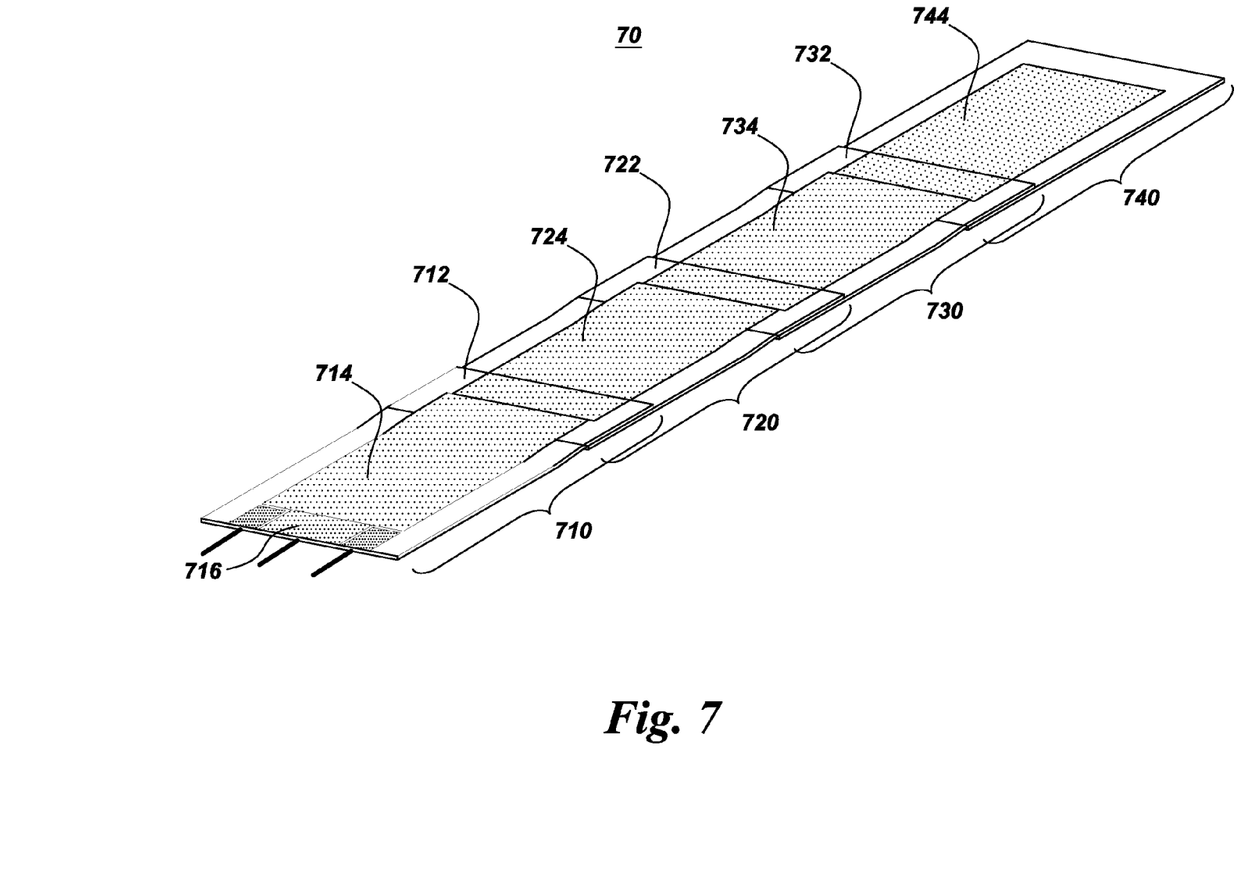
FIG. 7 is a schematic diagram of an array according to the present invention having a single row of packaged optoelectronic devices oriented with non-transparent portions of the edge seal zone linearly aligned.

FIG. 7 is a schematic view of array 70 showing overlapping packages 710, 720, 730, and 740 arranged in one row and oriented with non-transparent portions (not shown) of the edge seal zone of each device aligned parallel to non-transparent portion 716. Electroactive area 744 of the first device from the right in the row, device 740, is overlapped by transparent portion 732 of the edge seal zone of adjacent device 730. Transparent portions 712 and 722 of the edge seal zones of devices 710 and 720 in the row overlap electroactive areas 724 and 734 of adjacent devices 720 and 730. Electroactive areas 714, 724 and 734 overlap non-transparent portions (not shown) of the edge seal zone of devices 720, 730 and 740, which are aligned parallel to non-transparent portion 716 of device 710.

Figure 8:
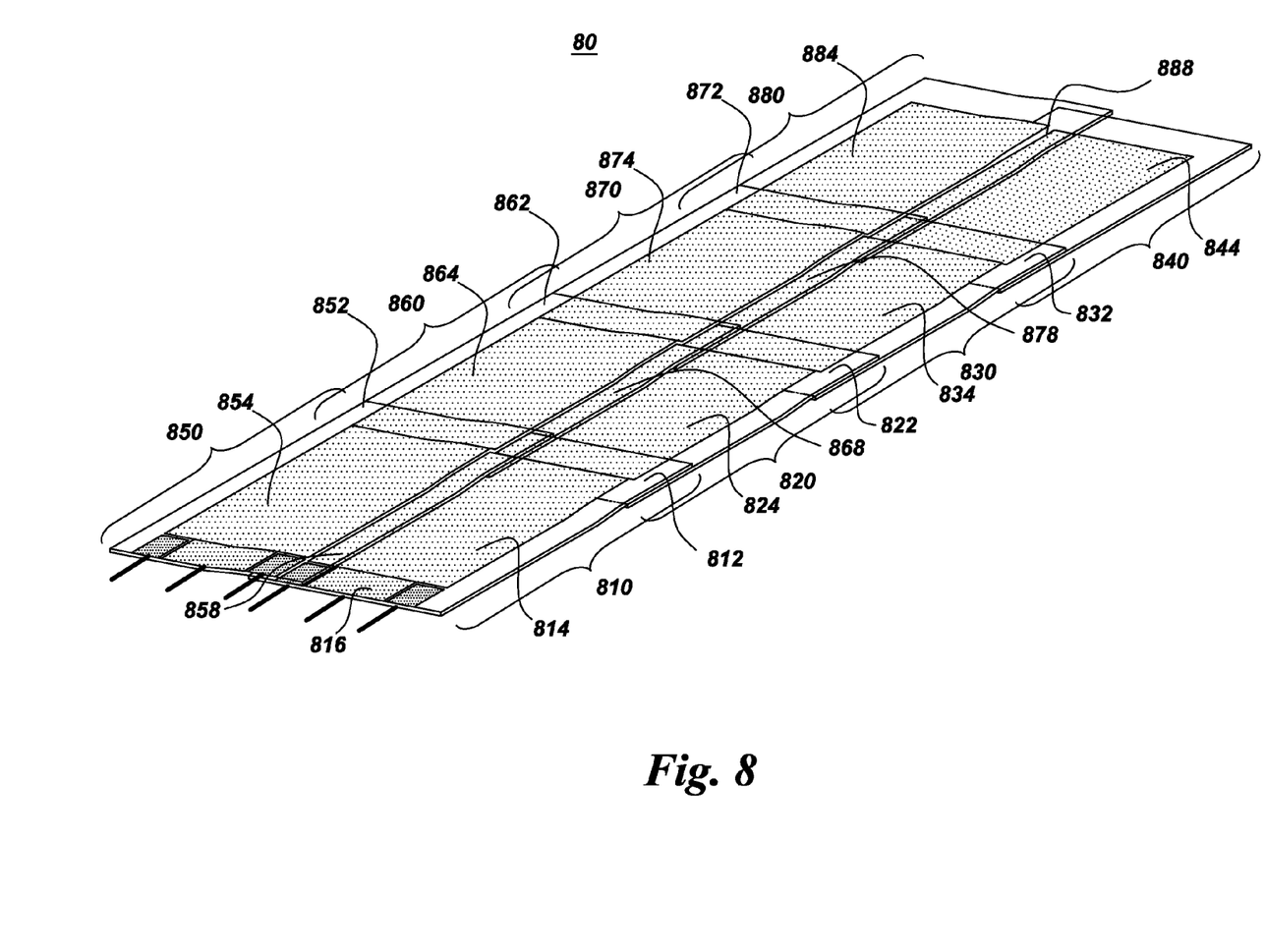
FIG. 8 is a schematic view of an array according to the present invention having two rows of packaged optoelectronic devices oriented with non-transparent portions of the edge seal zone linearly aligned.

FIG. 8 is a schematic view of array 80 showing two rows of overlapping packages 810, 820, 830, 840, 850, 860, 870, and 880 oriented with non-transparent portions (not shown) of the edge seal zone of each device in the first row aligned parallel to non-transparent portion 816, and non-transparent portions of the edge seal zone of each device in the second row (not shown) parallelly aligned. Electroactive area 844 of the first device from the right in the first row, device 840, is overlapped by transparent portion 832 of the edge seal zone of adjacent device 830. Transparent portions 812 and 822 of the edge seal zones of devices 810 and 820 in the row overlap electroactive areas 824 and 834 of adjacent devices 820 and 830. Electroactive area 884 of the first device from the right in the second row, device 880, is overlapped by transparent portion 872 of the edge seal zone of adjacent device 870. Transparent portions 852 and 862 of the edge seal zones of devices 850 and 860 in the row overlap electroactive areas 864 and 874 of adjacent devices 860 and 880. Electroactive areas 814, 824, and 834 of devices 810, 820, and 830 in the first row overlap non-transparent portions (not shown) of the edge seal zone of adjacent devices 820, 830, and 840 in the same row, and transparent portions 858, 868, 878, and 888 of the edge seal zones of devices 850, 860, 870, and 880 in the second row overlap non-transparent areas (not shown) of adjacent devices 810, 820, 830, and 840 in the first row. Non-transparent portions are connected to a power source via electrical leads.

Figure 9:
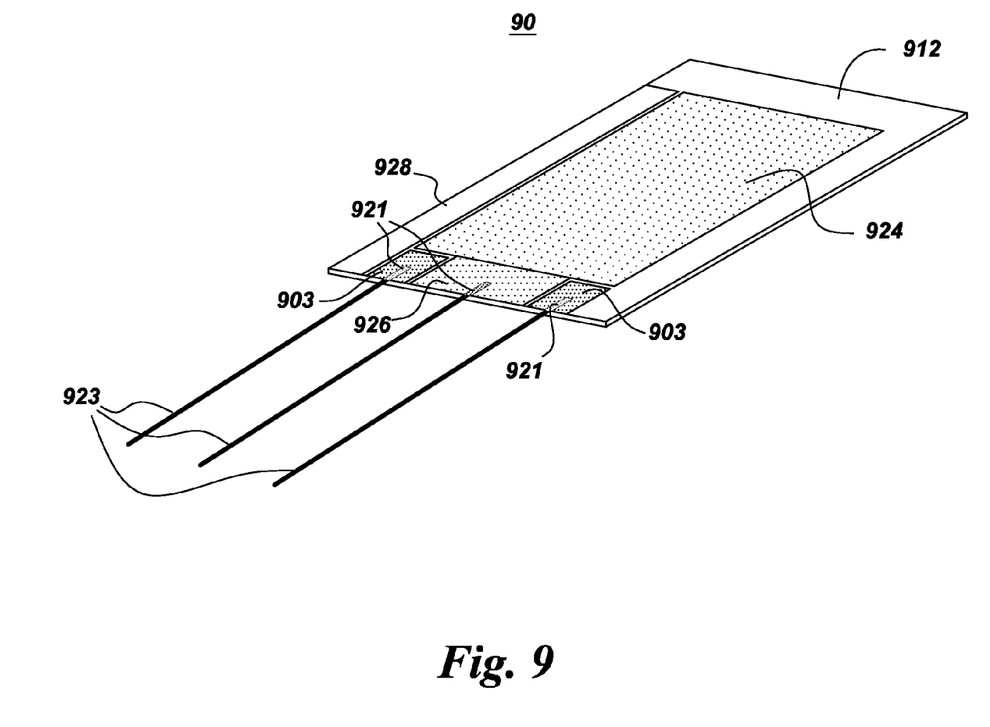
FIG. 9 is a schematic view of a package having two non-transparent portions of the edge seal zone.

FIG. 9 is a plan view of package 90 having transparent edge seal zones 912, electroactive area 924 and non-transparent edge seal zones 926 and 928. Edge 926 contains the anode and cathode (not shown) of the device, conductive areas 903, and optional conductive tab contacts 921. Edge 928 contains the anode (not shown) and a conductive layer disposed thereon for enhancing conductivity. Conductive areas 903 and the conductive layer of edge 928 are shown as a continuous layer in the figure, but in some embodiments, the conductive areas/layer may include one or more thin conductive lines for enhancing conductivity of the anode, and connected to a power source. Electric leads 923 may be connected between conductive tabs 921 and a power supply. Depending on the connector mounting scheme, the design of the contacts may vary. The figure depicts ribbon-type conductors that may be attached to the cathode and anode metal using a conductive adhesive. Whereas the conductive tabs may extend inward between the backsheet and the substrate, in some embodiments, it may be preferable to place them in an outboard configuration so that they do not interfere with sealing the edge. In other embodiments, the conductive tabs may be printed as a thin metal layer on the backsheet. Contact to the anode and cathode may be made with conductive adhesive. In addition, it may be desirable to add another layer on top of the electrode metallization adjacent to the backsheet that is resistant to attack from the environment, especially in the edge region that may remain exposed after backsheet application. This could in the form of a non-corroding metal, or it could be a UHB or other organic or inorganic barrier layer.

Figure 10:
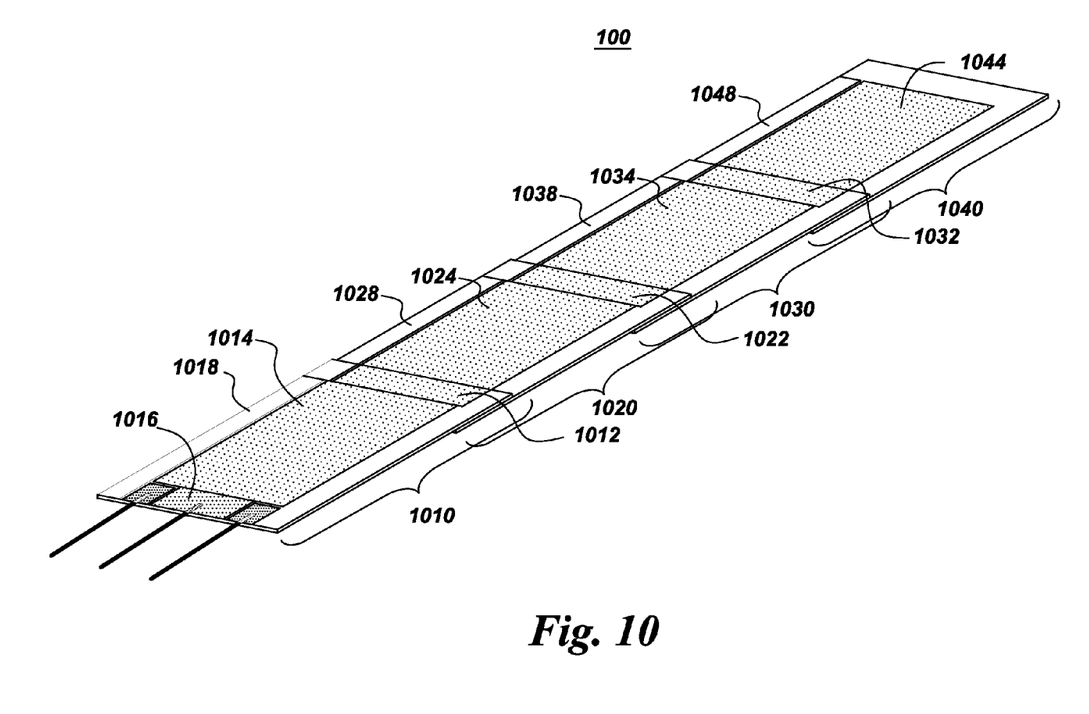
FIG. 10 is a schematic diagram of an array according to the present invention having a single row of packaged optoelectronic devices oriented with non-transparent portions of the edge seal zone parallelly aligned.

FIG. 10 is a schematic view of array 100 showing overlapping packages 1010, 1020, 1030, and 1040 arranged in one row and oriented with non-transparent portions of the edge seal zone of each device parallelly aligned. Non-transparent portions of the edge seal zone of devices 1020, 1030, and 1040 are arranged parallel to exposed non-transparent portion 1016 of device 1010. Electroactive area 1044 of the first device from the right in the row, device 1040, is overlapped by transparent portion 1032 of the edge seal zone of adjacent device 1030. Transparent portions 1012 and 1022 of the edge seal zones of devices 1010 and 1020 in the row overlap electroactive areas 1024 and 1034 of adjacent devices 1020 and 1030. Electroactive areas 1014, 1024 and 1034 overlap non-transparent portions (not shown) of the edge seal zone of devices 1020, 1030 and 1040, which are aligned parallel to non-transparent portion 1016 of device 1010. Non-transparent portions 1018, 1028, 1038, and 1048 of devices 1010, 1020, 1030, and 1040 are linearly aligned.

Figure 11:
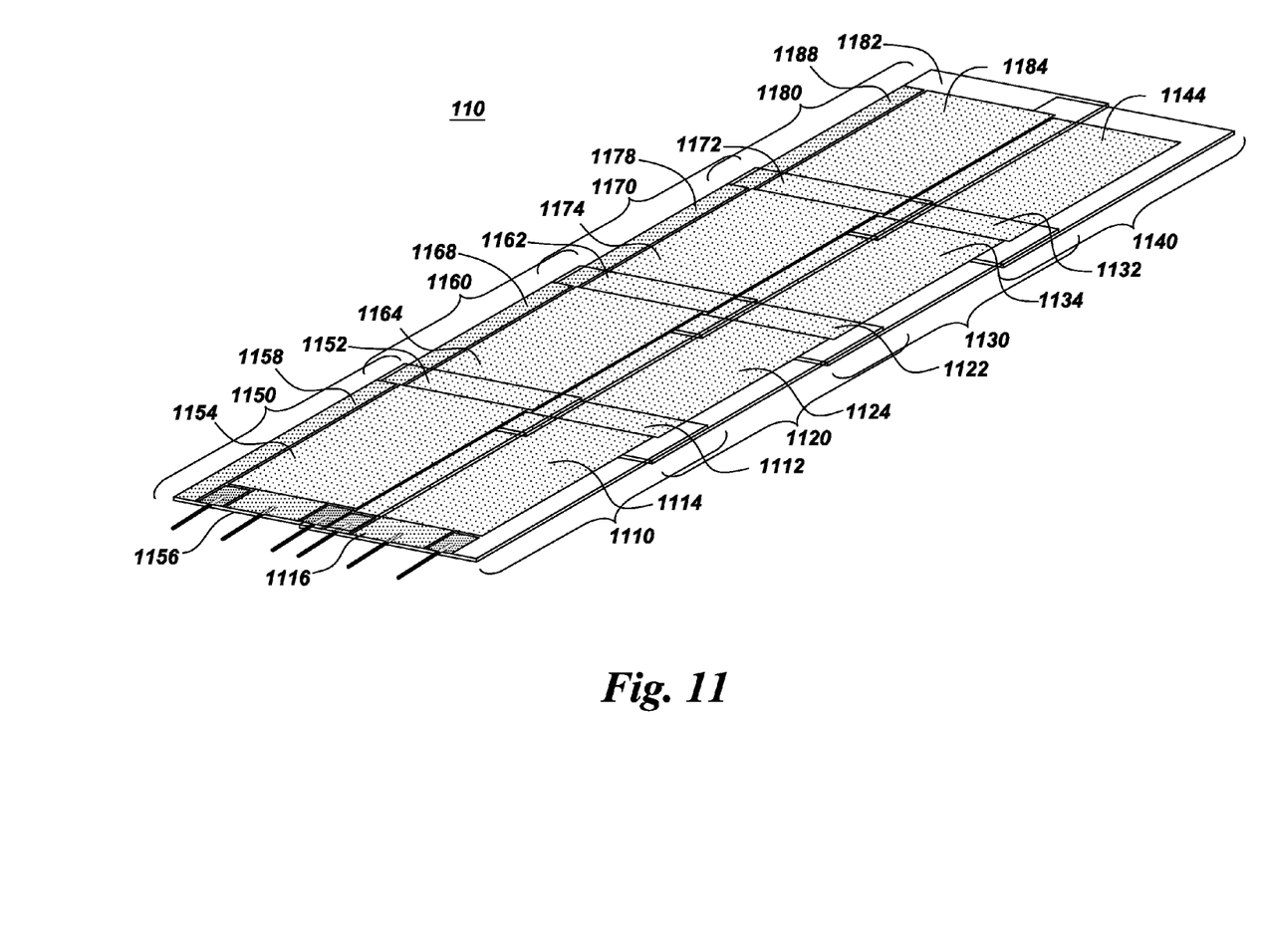
FIG. 11 is a schematic view of an array according to the present invention having two rows of packaged optoelec-

FIG. 11 is a schematic view of array 110 showing two rows of overlapping packages 1110, 1120, 1130, and 1140 oriented with non-transparent portions (not shown) of the edge seal zone of each device in the first row, and non-transparent portions 1158, 1168, 1178, and 1188 of devices 1150, 1160, 1170, and 1180 in the second row, aligned orthogonally to non-transparent portions 1116 and 1156 of devices 1110 and 1150, respectively. Electroactive area 1144 of the first device from the right in the first row, device 1140, is overlapped by transparent portion 1132 of the edge seal zone of adjacent device 1130. Transparent portions 1112 and 1122 of the edge seal zones of devices 1110 and 1120 in the row overlap electroactive areas 1124 and 1134 of adjacent devices 1120 and 1130. Electroactive area 1184 of the first device from the right in the second row, device 1180, is overlapped by transparent portion 1172 of the edge seal zone of adjacent device 1170. Transparent portions 1152 and 1162 of the edge seal zones of devices 1150 and 1160 in the row overlap electroactive areas 1164 and 1174 of adjacent devices 1160 and 1180. Electroactive areas 1114, 1124, and 1134 of devices 1110, 1120, and 1130 in the first row overlap non-transparent portions (not shown) of the edge seal zone of adjacent devices 1120, 1130, and 1140 in the same row, and electroactive areas 1154, 1164, 1174, and 1184 of devices 1150, 1160, 1170, and 1180 in the second row overlap non-transparent areas (not shown) of adjacent devices 1110, 1120, 1130, and 1140 in the first row. Non-transparent portions 1158, 1168, 1178, and 1188 of devices 1150, 1160, 1170, and 1180 remain exposed. Non-transparent portions are connected to a power source via electrical leads.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An array comprising a plurality of packages positioned in at least one row, each package enclosing an optoelectronic device and overlapping at least one adjacent package;
    wherein
    each package comprises an edge seal zone defining an electroactive area, and at least a portion of the edge seal zone is transparent;
    the electroactive area of a first package in each row is overlapped by the transparent portion of the edge seal zone of an adjacent package;
    the transparent portion of the edge seal zone of each package other than the first package in each row overlaps the electroactive area of an adjacent package;
    a portion of the edge seal zone of each package is non-transparent,
    the electroactive area of each package in the row overlaps the non-transparent portion of the edge seal zone of an adjacent package;
    the non-transparent portion of the edge seal zone comprises a conductive layer configured to connect an anode and a cathode of the optoelectronic device to an external power source via a plurality of terminals; and
    the cathode and the anode extend through a non-transparent portion of the edge seal zone.

2. An array according to claim 1, wherein each of the plurality of packages comprises a single pixel.

3. The array according to claim 1, wherein the plurality of packages is configured to form a continuous light emitting area.

4. The array according to claim 1, wherein edges of the non-transparent portion of the edge seal zone of each package are linearly aligned.

5. The array according to claim 4, wherein said edges are configured to be disposed along a linear bus bar and connected thereto.

6. The array according to claim 1, wherein edges of the non-transparent portion of the edge seal zone of each package are aligned in parallel.

7. The array according to claim 1, wherein
the plurality of packages are arranged in at least two rows; and
the transparent portion of the edge seal zone of each package in a first row overlaps the electroactive area of an adjacent package in the first row and the electroactive area of an adjacent package in a second row.

8. The array according to claim 7, wherein the electroactive area of each package in the first row overlaps the non-transparent portion of the edge seal zone of an adjacent package in the second row.

9. The array according to claim 1, wherein the conductive layer is disposed directly on the anode.

10. The array according to claim 1, additionally comprising an electrically insulating layer disposed between the anode and the conductive layer in the non-transparent portion of the edge seal zone, and configured to electrically isolate the anode from the cathode.

11. The array according to claim 1, wherein each optoelectronic device is an OLED.

12. An array comprising a plurality of packages positioned in at least one row, each package enclosing an optoelectronic device and overlapping at least one adjacent package;
wherein
each package comprises an edge seal zone defining an electroactive area, and at least a portion of the edge seal zone is transparent;
the electroactive area of a first package in each row is overlapped by the transparent portion of the edge seal zone of an adjacent package;
the transparent portion of the edge seal zone of each package other than the first package in each row overlaps the electroactive area of an adjacent package;
a portion of the edge seal zone of each package is non-transparent,
the electroactive area of each package in the row overlaps the non-transparent portion of the edge seal zone of an adjacent package;
the non-transparent portion of the edge seal zone comprises a conductive layer configured to connect an anode and a cathode of the optoelectronic device to an external power source via a plurality of terminals; and
the conductive layer is disposed directly on the anode.

13. The array according to claim 12, wherein each of the plurality of packages comprises a single pixel.

14. The array according to claim 13, wherein the plurality of packages is configured to form a continuous light emitting area.

15. The array according to claim 12, wherein edges of the non-transparent portion of the edge seal zone of each package are linearly aligned.

16. The array according to claim 12, wherein said edges are configured to be disposed along a linear bus bar and connected thereto.

17. The array according to claim 12, wherein edges of the non-transparent portion of the edge seal zone of each package are aligned in parallel.

18. The array according to claim 12, wherein
the plurality of packages are arranged in at least two rows; and
the transparent portion of the edge seal zone of each package in a first row overlaps the electroactive area of an adjacent package in the first row and the electroactive area of an adjacent package in a second row.

19. The array according to claim 18, wherein the electroactive area of each package in the first row overlaps the non-transparent portion of the edge seal zone of an adjacent package in the second row.

20. The array according to claim 12, wherein the cathode and the anode extend through a non-transparent portion of the edge seal zone.

21. The array according to claim 12, additionally comprising an electrically insulating layer disposed between the anode and the conductive layer in the non-transparent portion of the edge seal zone, and configured to electrically isolate the anode from the cathode.

22. The array according to claim 12, wherein each optoelectronic device is an OLED.

* * * * *